(12) United States Patent
Hanoka

(10) Patent No.: US 8,222,514 B2
(45) Date of Patent: Jul. 17, 2012

(54) BACKSKIN MATERIAL FOR SOLAR ENERGY MODULES

(75) Inventor: Jack I. Hanoka, Brookline, MA (US)

(73) Assignee: 7AC Technologies, Inc., Woburn, MA (US)

( * ) Notice: Subject to any disclaimer, the term of this patent is extended or adjusted under 35 U.S.C. 154(b) by 0 days.

(21) Appl. No.: 12/769,171

(22) Filed: Apr. 28, 2010

(65) Prior Publication Data

US 2011/0011444 A1   Jan. 20, 2011

Related U.S. Application Data

(60) Provisional application No. 61/173,449, filed on Apr. 28, 2009.

(51) Int. Cl.
  *H01L 31/042* (2006.01)
(52) U.S. Cl. .......... 136/251; 136/259
(58) Field of Classification Search .......... 136/251, 136/259
  See application file for complete search history.

(56) References Cited

U.S. PATENT DOCUMENTS

| | | | |
|---|---|---|---|
| 4,557,037 A | 12/1985 | Hanoka et al. |
| 4,691,077 A | 9/1987 | Gregory et al. |
| 4,945,065 A | 7/1990 | Gregory et al. |
| 4,989,059 A | 1/1991 | Micheels et al. |
| 5,082,791 A | 1/1992 | Micheels et al. |
| 5,151,377 A | 9/1992 | Hanoka et al. |
| 5,151,386 A | 9/1992 | Bottari et al. |
| 5,270,248 A | 12/1993 | Rosenblum et al. |
| 5,320,684 A | 6/1994 | Amick et al. |
| 5,476,553 A | 12/1995 | Hanoka et al. |
| 5,478,402 A | 12/1995 | Hanoka |
| 5,527,389 A | 6/1996 | Rosenblum et al. |
| 5,620,904 A | 4/1997 | Hanoka |
| 5,698,451 A | 12/1997 | Hanoka |
| 5,733,382 A | 3/1998 | Hanoka |
| 5,741,370 A | 4/1998 | Hanoka |
| 5,762,720 A | 6/1998 | Hanoka et al. |
| 5,986,203 A | 11/1999 | Hanoka et al. |
| 6,114,046 A | 9/2000 | Hanoka |
| 6,146,483 A | 11/2000 | Hanoka et al. |
| 6,187,448 B1 | 2/2001 | Hanoka et al. |
| 6,206,996 B1 | 3/2001 | Hanoka et al. |
| 6,278,053 B1 | 8/2001 | Hanoka et al. |
| 6,320,116 B1 | 11/2001 | Hanoka |
| 6,353,042 B1 | 3/2002 | Hanoka et al. |
| 6,479,316 B1 | 11/2002 | Hanoka et al. |
| 6,586,271 B2 | 7/2003 | Hanoka |

(Continued)

OTHER PUBLICATIONS

K. Cho and H. K. Jeon, Thermal and mechanical properties of HDPE/ionomer blends, 1993, J. of Material Science, 28, 6650-6656.*

(Continued)

*Primary Examiner* — Jonathan Johnson
*Assistant Examiner* — Miriam Berdichevsky
(74) *Attorney, Agent, or Firm* — Rajesh Vallabh; Foley Hoag LLP

(57) ABSTRACT

A solar energy module includes one or more solar cells, each having a front side for receiving light and an opposite back side. An encapsulant material covers at least the front side of each of the solar cells. The solar energy module also includes a backskin layer formed from a cross-linked mixture of high density polyethylene (HDPE) and acid copolymer bonded to the back side of each of the solar cells.

27 Claims, 2 Drawing Sheets

U.S. PATENT DOCUMENTS

| | | |
|---|---|---|
| 2002/0038664 A1* | 4/2002 | Zenko et al. ............ 136/251 |
| 2003/0098059 A1 | 5/2003 | Hanoka |
| 2005/0061363 A1 | 3/2005 | Ginley et al. |
| 2008/0041442 A1 | 2/2008 | Hanoka |
| 2008/0047599 A1 | 2/2008 | Buller et al. |
| 2008/0078445 A1* | 4/2008 | Patel et al. ............ 136/256 |
| 2008/0111206 A1 | 5/2008 | Hanoka et al. |
| 2008/0149170 A1 | 6/2008 | Hanoka |
| 2008/0223433 A1 | 9/2008 | Hanoka et al. |
| 2008/0264484 A1* | 10/2008 | Temchenko et al. .......... 136/256 |
| 2009/0014055 A1 | 1/2009 | Beck et al. |
| 2009/0084425 A1 | 4/2009 | Milshtein et al. |

OTHER PUBLICATIONS

International Search Report and Written Opinion for PCT/US2010/032730 dated Dec. 14, 2010.

* cited by examiner

BACKSKIN MATERIAL FOR SOLAR ENERGY MODULES

CROSS REFERENCE TO RELATED APPLICATIONS

This application claims priority from U.S. Provisional Patent Application Ser. No. 61/173,449, filed on Apr. 28, 2009, entitled Backskin Material For Photovoltaic Modules, which is hereby incorporated by reference.

BACKGROUND

The present application relates generally to solar energy modules and, more particularly, to a backskin material to protect and seal solar cells.

Solar energy modules include solar cells (also known as photovoltaic cells) for generating electricity from sunlight. The most common type of solar cell is a crystalline silicon solar cell. Other types of solar cells are based on thin film technology. Thin film solar cells can be made, e.g., from amorphous silicon (α-Si), cadmium telluride (CdTe), and copper indium gallium diselenide (CIGS). Other types of solar cells include cells that are made from polymers, so-called dye sensitized cells, and nano particles.

Crystalline silicon solar cell modules as well as many thin film modules have a sheet of glass on the light receiving side (i.e., front side) and a polymeric sheet on the back side of the module. The polymeric sheet on the back side of the module is usually termed the backskin.

A widely used backskin is a three layered laminate utilizing a vinyl fluoride film such as Tedlar® (a trademark of E. I. DuPont de Nemours and Company, Wilmington, Del.) as an outer layer of the three layers. The outer layer is generally on the order of about 1 to 2 mils thick. The center layer of this type of conventional backskin material is usually formed from a layer of polyethylene terephthalate (PET), and is typically about 6 to 8 mils thick. Examples of materials utilized for the formation of the inner layer include Tedlar® and ethylene vinyl acetate (EVA).

Components of photovoltaic modules can be subjected to qualification requirements established by Underwriters Laboratories (UL) of Northbrook, Ill. for meeting certain electrical and mechanical characteristics. In particular, photovoltaic modules and their components are tested to determine their Relative Thermal Index (RTI). The RTI is a measure of the creep resistance of a material at high temperatures. Materials in a photovoltaic module have a minimum temperature requirement of 90° C. and typically are subjected to temperatures as high as about 150° C. during testing.

BRIEF SUMMARY OF EMBODIMENTS OF THE INVENTION

A solar energy module in accordance with one or more embodiments includes one or more solar cells, each having a front side for receiving light and an opposite back side. An encapsulant material covers at least the front side of each of the solar cells. The solar energy module also includes a backskin layer formed from a cross-linked mixture of high density polyethylene (HDPE) and acid copolymer bonded to the back side of each of the solar cells.

One or more further embodiments are directed to a backskin for a solar energy module. The backskin comprises a sheet having a thickness of about 10 to 40 mils of a cross-linked HDPE and acid copolymer mixture including one or more additives selected from the group consisting of mineral fillers, pigments, and fillers designed to enhance thermal conductivity such as AlN, SiC, ZnO, BN, MgO, $Al_2O_3$ and combinations thereof.

One or more further embodiments are directed to a method of manufacturing a solar energy module. The method includes the steps of: providing one or more solar cells, each solar cell having a front side for receiving light and an opposite back side; bonding an encapsulant material to the one or more solar cells to form an encapsulant coating covering at least the front side of each of the one or more solar cells; providing a backskin layer formed from a cross-linked high density polyethylene (HDPE) and acid copolymer mixture formed into a sheet; and bonding the backskin layer to the back side of each of the one or more solar cells.

Various embodiments of the invention are provided in the following detailed description. As will be realized, the invention is capable of other and different embodiments, and its several details may be capable of modifications in various respects, all without departing from the invention. Accordingly, the drawings and description are to be regarded as illustrative in nature and not in a restrictive or limiting sense, with the scope of the application being indicated in the claims.

BRIEF DESCRIPTION OF THE DRAWINGS

Like reference numbers denote like components in the figures.

DETAILED DESCRIPTION

Figure 1A:
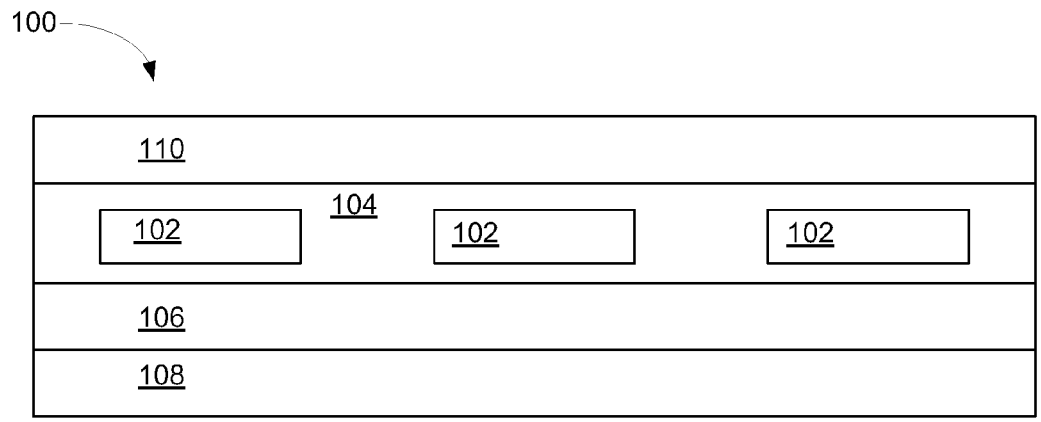
FIG. 1A is a simplified cross-sectional view of a photovoltaic module in accordance with one or more embodiments.

In accordance with one or more embodiments, a backskin comprising a cross-linked high density polyethylene (HDPE) and acid copolymer mixture is provided for solar energy modules. The backskin can be used for various types of solar energy modules including "PV" or photovoltaic modules (which generate electricity from sunlight) and "PVT" or photovoltaic-thermal modules (which generate electricity and collect heat from sunlight).

The backskin comprises a sheet formed from a cross-linked HDPE and acid copolymer mixture, which can be produced using recycled (i.e., post consumer) HDPE. The backskin is generally inexpensive to produce as the raw materials used for its production are inexpensive and widely available. The cost savings realized in the production of the backskin material in accordance with various embodiments over conventional backskin materials can lead to a reduction in the cost of electricity generated by photovoltaic modules.

An acid copolymer is added to raw HDPE materials prior to cross-linking the mixture. The acid copolymer provides improved adhesive properties to the backskin, particularly for adhering to aluminum. For example, about 10% to 80% acid copolymer can be added to an HDPE resin, which is then formed into a sheet that is irradiated with an electron beam to form a cross linked HDPE-acid copolymer sheet. The backskin preferably includes no ionomer additives.

As normally constituted, HDPE has two characteristics that could render it unsuitable use in a solar energy module. Normally constituted HDPE has a high coefficient of thermal expansion (CTE) ranging from 59 to $110 \times 10^{-6}/°$ C. In comparison, glass has a CTE value of about $9 \times 10^{-6}/°$ C. As a result of this difference in CTE values between HDPE and glass, contraction on cooling of a solar energy module with glass on the front and HDPE as the backskin can result in unacceptable stresses on the glass and the rest of the PV module. Normally constituted HDPE is also not likely meet RTI minimal requirement of 90° C. HDPE melts at about 130° C. so, as normally constituted, it would not satisfy the RTI tests and requirements.

As a result, the HDPE-acid copolymer material utilized in various embodiments disclosed herein is cross-linked. By cross linking the HDPE-acid copolymer (which can be made using recycled HDPE), the material properties can be tailored for use within a solar energy module. For example, the CTE value of a cross-linked HDPE-acid copolymer material can be reduced to be closer to the CTE of glass. In addition, HDPE-acid copolymer material can be cross-linked to improve its electrical properties such as, e.g., to increase its dielectric properties, as well as to improve its mechanical properties such as, e.g., to provide for an increase in the modulus of elasticity of the HDPE-acid copolymer material. Cross linking can be accomplished in several ways. It can be done, e.g., by the addition of vinyl silanes and subsequent moisture cure. Cross linking can also be accomplished by the addition of peroxides to the resin before processing. In addition, cross-linking can be achieved by subjecting the material to electron beam irradiation after it has been formed into sheet.

In one or more embodiments, the HDPE-acid copolymer material utilized in solar energy modules is further modified by the addition of mineral fillers. In some embodiments, mineral fillers are added to the HDPE mixture or post consumer HDPE prior to forming a sheet and irradiating the sheet to cross link the HDPE mixture to form the backskin material. Exemplary mineral fillers include, without limitation, calcium carbonate, dolomite, conventional kaolin clays, nano particulate clays, silica, talc, wollastonite and mica. The mineral fillers can be in the form of nano particles. In particular, the mineral fillers have a dimension (length, width, depth, diameter, etc.) that is less than about 500 nm such as, e.g., 250 nm, 200 nm, 100 nm, 50 nm, 25 nm, 10 nm, 5 nm, and 1 nm. The mineral fillers can modify the material properties of the HDPE-acid copolymer material. For example, additions of calcium carbonate particles can provide a further reduction in the CTE value of the HDPE-acid copolymer material. Another possible filler material is glass. A glass filler can be provided in the HDPE-acid copolymer in particle form or as a fiber. The glass filler can also have a nanosized dimension.

In one or more embodiments, the cross linked HDPE-acid copolymer material is filled with aluminum nitride (AlN). Aluminum nitride is known to have a high thermal conductivity while still being a non-conductor electrically. (See, e.g., Geon-Woong Lee et al, "Enhanced Thermal Conductivity Of Polymer Composites Filled With Hybrid Filler," Composites Part A: Applied Science and Manufacturing, Vol. 37, Issue 5, May 2005, p. 727-734.) By using an AlN filled cross-linked HDPE backskin material, a photovoltaic module may have an increased effectiveness at dissipating heating during operation. Photovoltaic modules, especially crystalline silicon photovoltaic modules, generate less power as they get hotter. Increasing the thermal conductivity of the backskin material helps to remove some of the heat collected in the module, thus resulting in more power generated from the module. Such backskin material could be particularly useful for low concentration (e.g., up to about 10×) solar cell modules where, because of the concentrated sunlight, much greater heating is possible. An aluminum nitride filler can also further reduce the CTE value of the cross-linked HDPE material. Other possible fillers to increase the thermal conductivity include SiC, ZnO, BN, MgO, $Al_2O_3$ and combinations thereof.

In accordance with one or more embodiments, pigments may be added to color or tint the backskin material. For example, up to about 10 weight percent $TiO_2$ particles can be added to color the backskin material white and/or increase its reflectivity. In another embodiment, up to about 5 weight percent carbon black is added to color the backskin material black. Other pigments producing colors other than white or black can also be used. In one or more further embodiments, light stabilizers, such as up to about 0.5 weight percent of a hindered amine light stabilizer can be added to the backskin material to inhibit yellowing or discolorization of the backskin material.

One or more embodiments are directed a method for encapsulating a photovoltaic material. In general, HDPE is known to have a high surface energy. As a result of the high surface energy of the backskin (even as modified with a mixture of acid copolymer and through cross linking and addition of filler materials), it can be difficult to adhere other polymer layers to the backskin material. In accordance with one or more embodiments, this can be addressed through a process of lamination. Surprisingly, Applicant has found that a backskin layer including a cross-linked HDPE-acid copolymer material can be adhered to an encapsulant layer (e.g., a transparent layer used for protection of the cell and generally formed of ethylene vinyl acetate, an ionomer, or an acid copolymer) by heating one or both of the encapsulant layer and backskin layer to a temperature close to (e.g., ±5° C.) their respective melting points and then applying pressure to laminate the layers together. In this way, it has been demonstrated that sheets of HDPE-acid copolymer can be bonded with thin layers of encapsulant materials such as, e.g., ethylene vinyl acetate (EVA) or ionomer or the precursor to ionomer, or acid copolymers such as acrylic acid and methacrylic acid and ethylene. Similarly, the sheet of HDPE-acid copolymer can be bonded with a thin layer of ionomer or acid copolymer to form an outer layer used to facilitate attachment of a photovoltaic module to a mounting device, such as an aluminum mounting plate or bracket.

FIG. 1A is a simplified cross-sectional view of a PV solar energy module, in particular a photovoltaic module 100, in accordance with one or more embodiments. (FIG. 1A as well as the other figures in this application are schematic and not drawn to scale.) The photovoltaic module 100 includes one or more photovoltaic or solar cells 102 arranged in a layer. Examples of suitable materials for the photovoltaic cells 102 include, but are not limited to, crystalline silicon, thin film solar cells (e.g., amorphous silicon, cadmium telluride, and copper indium gallium diselenide), and solar cells made from polymers, so-called dye sensitized cells, and nano particles.

The front sides of the photovoltaic cells 102 (i.e., the side exposed to light) are covered by an encapsulant layer 104. A backskin layer 106 is provided on the back side of the photovoltaic cells 102. In the embodiment shown in FIG. 1A, the encapsulant layer 104 wraps completely around the photovoltaic cells 102, sealing the photovoltaic material. The backskin layer 106 is applied directly on the encapsulant layer 104.

Figure 1B:
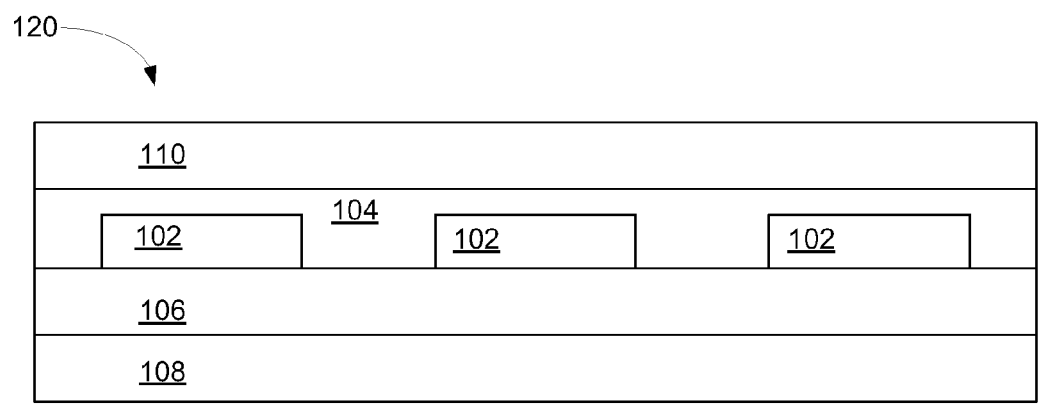
FIG. 1B is a simplified cross-sectional view of an alternative photovoltaic module in accordance with one or more embodiments.

FIG. 1B illustrates a photovoltaic module 120, in which the encapsulant layer 104 covers the front and sides of the photovoltaic cells 102, but does not wrap around to the back sides of the cells 102. In this case, the backskin layer 106 is applied directly to the back sides of the cells 102.

In accordance with one or more embodiments, an outer layer 108 formed of an ionomer or an acid copolymer is provided on the back side of the backskin layer 106 (i.e., the side of the backskin layer 106 opposite the photovoltaic cells 102). The outer layer 108 can be relatively thin (e.g., less than about 25 mils) and is provided to facilitate bonding between the photovoltaic modules 100 or 120 and a mounting device such as an aluminum plate or bracket.

A transparent front cover 110 of glass or a polymer is disposed on the front side of the encapsulant layer 104 to seal and protect the solar cells and other components from impact and environmental degradation.

Figure 2A:
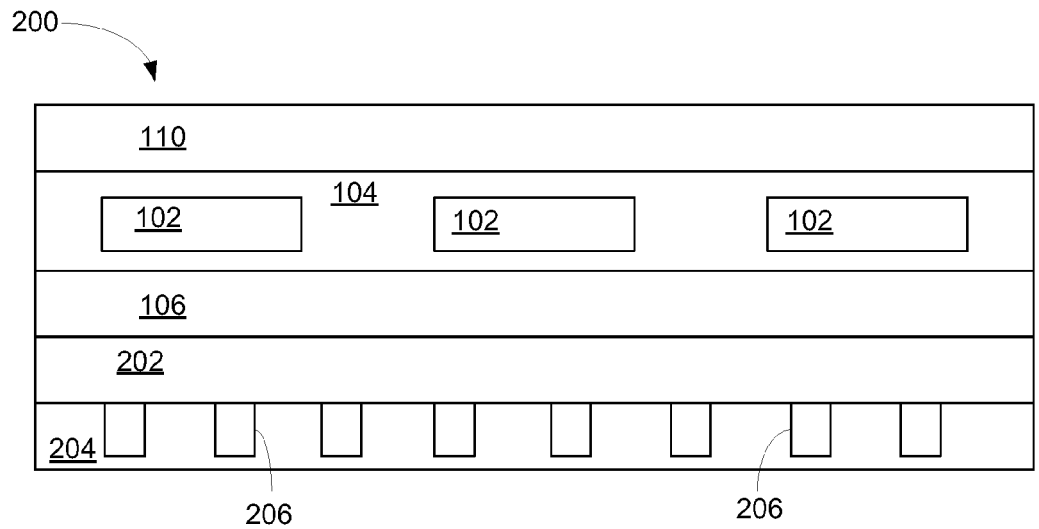
FIG. 2A is a simplified cross-sectional view of a photovoltaic-thermal module in accordance with one or more embodiments.

FIG. 2A is a simplified cross-sectional view of a PVT solar energy module 200 in accordance with one or more embodiments. In addition to generating electricity, the module 200 removes heat collected in the module by transferring it to a thermal transfer fluid. As with the photovoltaic module 100, the module 200 includes one or more photovoltaic or solar cells 102 arranged in a layer. An encapsulant layer 104 wraps completely around the photovoltaic cells 102, sealing the photovoltaic material. A backskin layer 106 is applied directly on the encapsulant layer 104. The module 200 includes a solar thermal unit 204 on the back side of the backskin layer 106 opposite to the solar cells. The solar thermal unit 204 includes a plurality of conduits 206 extending the unit 204. A thermal transfer fluid flows through the conduits. Heat from the solar cells 102 is conducted through the encapsulant layer and the backskin layer to the thermal transfer fluid.

The thermal transfer fluid can comprise various types of thermal transfer liquids including, e.g., water or a water-glycol mixture. The thermal transfer fluid flows through the unit 204 and the heated transfer fluid can be accumulated and stored in a tank until needed.

Figure 2B:
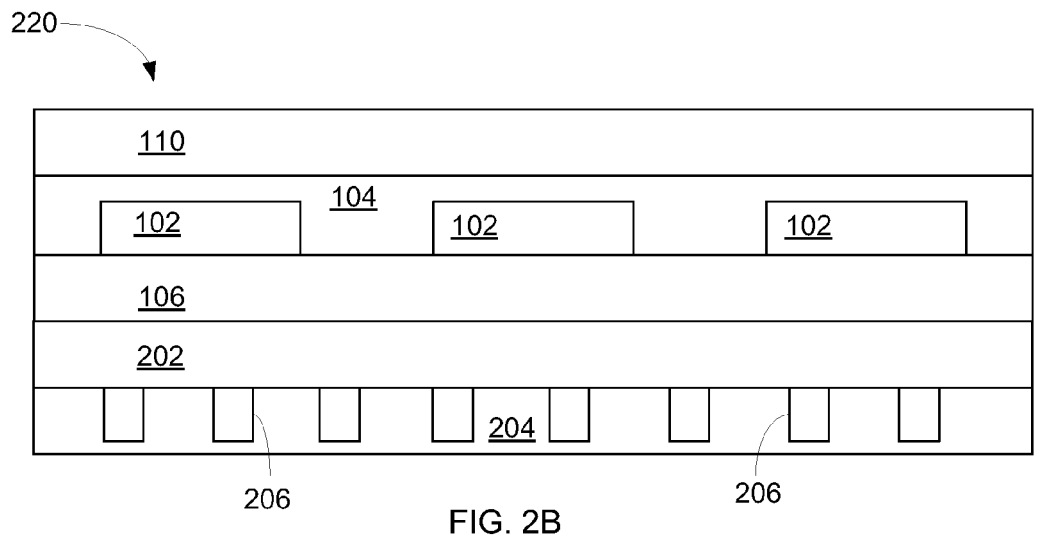
FIG. 2B is a simplified cross-sectional view of an alternative photovoltaic-thermal module in accordance with one or more embodiments.

FIG. 2B is a simplified cross-sectional view of an alternate PVT solar energy module 220, in which the encapsulant layer 104 covers the front and sides of the photovoltaic cells 102, but does not wrap around to the back sides of the cells 102. In this case, the backskin layer 106 is applied directly to the back sides of the cells 102.

In accordance with one or more embodiments, an optional layer of aluminum 202 is provided between the backskin 106 and the solar thermal unit 204. The layer of aluminum 202 has one side bonded to the backskin 106 and an opposite side bonded to the solar thermal unit 204. The layer of aluminum 202 can have a thickness of about 1 to 63 mils.

In other embodiments, the backskin is bonded directly to the back side of solar cells, which can include an aluminum back contact covering substantially the entire back surface of the solar cell.

The backskin layer 106 for the various embodiments described herein is formed from a cross-linked HDPE-acid copolymer mixture. HDPE is a low-cost, widely available polymer. The backskin layer 106 can be made from recycled HDPE, which is generally readily available, e.g., from used milk bottles. A recent article in Waste Age magazine (April 2007 issue) reported that about 0.8 million tons of scrap HDPE bottles (mostly milk bottles) are produced each year. As a result of this large availability of waste HDPE, HDPE for use as backskin material can be inexpensive and readily available. (It is estimated that only 60,000 tons of HDPE will be needed to create backskin material for 10 gigawatts of solar energy modules.)

An HDPE-acid copolymer material can provide improved barrier properties to the ingress of water vapor and oxygen into a module compared to conventional backskin materials. For example, for water vapor transmission, a Tedlar® conventional backskin has a value of 0.36 gm/m$^2$/24 hr, whereas non cross-linked HDPE (assuming a thickness of 20 mils) is 0.003 gm/m$^2$/24 hr, more than 100 times better. Cross-linking further improves this number. Thus, a cross-linked HDPE-acid copolymer backskin can be a better alternative both in performance and cost to Tedlar®. Additionally, a cross-linked HDPE-acid copolymer backskin can be more cost effective than the tempered window glass used in some cases as backskin for crystalline silicon and thin film modules.

In one or more embodiments, the backskin layer 106 is made from sheets of HDPE-acid copolymer that are irradiated with an electron beam to cross link the HDPE-acid copolymer. The radiation dosage is preferably about 10 megarads or less.

In some embodiments, the backskin layer will have a thickness of between about 10 mils to 50 mils (e.g., 10 mils to 40 mils thick or 20 mils to 35 mils thick). In certain embodiments, the HDPE sheets are made from recycled HDPE material (e.g., milk bottles/containers formed in part of HDPE).

It is also possible to cross link the HDPE-acid copolymer material using techniques other than electron beam irradiation. For example, vinyl silanes can be added to an HDPE-acid copolymer mixture followed by a moisture cure to obtain a cross-linked HDPE material.

In one or more embodiments, fillers or additives are introduced in the backskin layer 106. For example, mineral fillers such as calcium carbonate, dolomite, conventional kaolin clays, nano particulate clays, silica, talc, wollastonite, mica, and glass can be added to the HDPE-acid copolymer materials prior to cross linking it. The mineral fillers can be in the form of nano particles. Without being bound by theory, it is believed that the addition of the mineral fillers provides a reduction in the coefficient of thermal expansion (CTE) value of the cross linked HDPE-acid copolymer material. The fillers may also be used to tailor material properties other than the CTE value of the HDPE-acid copolymer material including, e.g., melting temperature, modulus of elasticity, thermal conductivity, or reflectivity.

Other additives can also be introduced to modify the material properties of the cross linked backskin material, in particular the resistance to degradation under exposure to ultra violet light contained in the solar spectrum, e.g., up to 0.5% of a hindered amine light stabilizer.

A method for producing the backskin material used in layer 106 in accordance with one or more embodiments can include the steps of: obtaining used milk bottles; recycling the milk bottles to produce an HDPE resin; adding an acid copolymer and optionally one or more fillers and/or additives to the resin; forming a sheet from the resin having a thickness of about 10 to 40 mils; and irradiating the sheet with an electron beam to form a cross linked HDPE-acid copolymer sheet.

A method of producing a solar energy module in accordance with one or more embodiments includes the steps of: providing one or more photovoltaic cells 102; applying an encapsulant material 104 on the cells 102 to form an encapsulant coating about the photovoltaic cells 102; applying a backskin layer 106 formed from a cross linked HDPE-acid copolymer sheet having a thickness of about 10 to 40 mils to the back side of the cells 102 in direct contact with at least a portion of the encapsulant coating; heating at least one the backskin layer 106 and the encapsulant material 104 to a temperature that is substantially similar to its respective melting point temperature; and applying pressure to laminate at least a portion of the backskin layer 106 to the encapsulant material 104. In one or more embodiments, the method further includes bonding a solar thermal unit to the backskin layer to transfer heat from the solar cells to a thermal transfer fluid.

A method for forming a solar energy module in accordance with one or more further embodiments includes the steps of: providing one or more photovoltaic cells 102; applying an encapsulant material 104 to a front side of photovoltaic cells 102 to form an encapsulant layer; applying a backskin layer 106 formed from a cross-linked HDPE-acid copolymer sheet having a thickness of about 10 to 40 mils to the back side of the photovoltaic cells 102; bonding a solar thermal unit to the backskin layer to transfer heat from the solar cells to a thermal transfer fluid.

A method for forming a solar energy module in accordance with one or more further embodiments includes the steps of: providing one or more photovoltaic cells 102; applying an encapsulant material 104 to a front side of photovoltaic cells 102 to form an encapsulant layer; applying a backskin layer 106 formed from a cross-linked HDPE-acid copolymer sheet having a thickness of about 10 to 40 mils to the back side of the photovoltaic cells 102; applying an outer layer 108 formed of ionomer or acid copolymer to the backskin layer 106; heating at least one of the backskin layer 106 and the outer layer 108 to a temperature that is substantially similar to its respective melting point temperature; and applying pressure to laminate at least a portion of the backskin layer 106 to the outer layer 108.

It is to be understood that although the invention has been described above in terms of particular embodiments, the foregoing embodiments are provided as illustrative only, and do not limit or define the scope of the invention. Various other embodiments, including but not limited to the following, are also within the scope of the claims. For example, elements and components described herein may be further divided into additional components or joined together to form fewer components for performing the same functions.

Having described preferred embodiments of the present invention, it should be apparent that modifications can be made without departing from the spirit and scope of the invention.

What is claimed is:

1. A solar energy module, comprising:
   one or more solar cells, each solar cell having a front side for receiving light and an opposite back side;
   an encapsulant material covering the front side and the back side of each of the one or more solar cells; and
   a backskin layer formed from a cross-linked mixture of high density polyethylene (HDPE) and acid copolymer bonded to the encapsulant material covering the back side of each of the one or more solar cells, wherein the backskin layer comprises a material that is different from the encapsulant material.

2. The solar energy module of claim 1 further comprising a solar thermal unit attached to a side of the backskin layer opposite to the one or more solar cells for transferring heat from the one or more solar cells to a thermal transfer fluid flowing through the solar thermal unit.

3. The solar energy module of claim 2 further comprising a layer of aluminum between the backskin and the solar thermal unit, said layer of aluminum having one side bonded to the backskin and an opposite side bonded to the solar thermal unit.

4. The solar energy module of claim 3 wherein the layer of aluminum has a thickness of 1 to 63 mils.

5. The solar energy module of claim 1 wherein the backskin layer has a thickness of 10 to 40 mils.

6. The solar energy module of claim 1 wherein the backskin layer is laminated on the back side of each of the one or more solar cells.

7. The solar energy module of claim 1 further comprising a front glass cover disposed on the encapsulant material on the front side of the one or more solar cells, and wherein the backskin layer includes additives or fillers for reducing the thermal coefficient of expansion of the backskin layer to be closer to that of the front glass cover.

8. The solar energy module of claim 1 wherein the mixture comprises 10% to 80% acid copolymer.

9. The solar energy module of claim 1 wherein the acid copolymer is a copolymer of ethylene and acrylic acid or ethylene and methacrylic acid.

10. The solar energy module of claim 1 wherein the backskin layer is formed by irradiating a sheet of an HDPE-acid copolymer mixture with an electron beam to cross-link the HDPE.

11. The solar energy module of claim 1 wherein the backskin layer is formed by adding vinyl silanes to the mixture of HDPE and acid copolymer and moisture curing the resulting mixture to cross-link the HDPE.

12. The solar energy module of claim 1 wherein the backskin layer includes one or more additives.

13. The solar energy module of claim 12 wherein the one or more additives comprise one or more mineral fillers selected from the group consisting of dolomite, conventional kaolin clays, silica, talc, wollastonite, calcium carbonate, mica, glass, and combinations thereof.

14. The solar energy module of claim 12 wherein the one or more additives comprise nano particles.

15. The solar energy module of claim 12 wherein the one or more additives comprise at least one color additive or pigment.

16. The solar energy module of claim 15 wherein the color additive or pigment comprises up to 10% of $TiO_2$ to make the backskin material white or reflective.

17. The solar energy module of claim 15 wherein the additive comprises up to 0.5% of a hindered amine light stabilizer.

18. The solar energy module of claim 15 wherein the color additive or pigment comprises up to 5% carbon black to make the backskin material black.

19. The solar energy module of claim 12 wherein the one or more additives comprise AlN, SiC, ZnO, BN, MgO, or $Al_2O_3$, or combinations thereof.

20. A solar energy module comprising:
    one or more solar cells, each solar cell having a front side for receiving light and opposite back side;
    an encapsulant material covering the front side and the back side of each of the one or more solar cells; and
    a backskin comprising a sheet having a thickness of 10 to 40 mils of a cross-linked HDPE and acid copolymer mixture including one or more additives selected from the group consisting of acid copolymers, mineral fillers, pigments, AlN, SiC, ZnO, BN, MgO, $Al_2O_3$ and combinations thereof, said backskin being bonded to the encapsulant material covering the back side of each of the one or more solar cells, wherein the backskin layer comprises a material that is different from the encapsulant material.

21. The solar energy module of claim 20 wherein the backskin is formed by irradiating a sheet formed from the mixture of HDPE and acid copolymer with an electron beam to cross-link the HDPE.

22. The solar energy module of claim 20 wherein the backskin is formed by adding vinyl silanes to the HDPE and copolymer mixture and moisture curing the resulting mixture to cross-link the HDPE.

23. The solar energy module of claim 20 wherein the mineral fillers are selected from the group consisting of dolomite, conventional kaolin clays, silica, talc, wollastonite, calcium carbonate, mica, glass, and combinations thereof.

24. The solar energy module of claim 20 wherein the one or more additives comprise nano particles.

25. The solar energy module of claim 20 wherein the pigments comprise up to 10% of $TiO_2$ to make the backskin white or reflective.

26. The solar energy module of claim 20 wherein the additive comprises up to 0.5% of a hindered amine light stabilizer.

27. The solar energy module of claim 20 wherein the pigments comprise up to 5% carbon black to make the backskin material black.

* * * * *